United States Patent
Wei et al.

(10) Patent No.: US 10,529,590 B2
(45) Date of Patent: Jan. 7, 2020

(54) ANNEALING METHOD FOR IMPROVING BONDING STRENGTH

(71) Applicant: Shanghai Simgui Technology Co., Ltd., Shanghai (CN)

(72) Inventors: Xing Wei, Shanghai (CN); Yongwei Chang, Shanghai (CN); Meng Chen, Shanghai (CN); Guoxing Chen, Shanghai (CN); Lu Fei, Shanghai (CN); Xi Wang, Shanghai (CN)

(73) Assignee: Shanghai Simgui Technology Co., Ltd., Shanghai (CN)

( * ) Notice: Subject to any disclaimer, the term of this patent is extended or adjusted under 35 U.S.C. 154(b) by 0 days.

(21) Appl. No.: 15/906,074

(22) Filed: Feb. 27, 2018

(65) Prior Publication Data

US 2018/0330964 A1    Nov. 15, 2018

(30) Foreign Application Priority Data

Dec. 27, 2016    (CN) .......................... 2016 1 1227760

(51) Int. Cl.
| | |
|---|---|
| *H01L 21/324* | (2006.01) |
| *H01L 21/02* | (2006.01) |
| *H01L 21/16* | (2006.01) |
| *H01L 21/762* | (2006.01) |
| *H01L 21/768* | (2006.01) |

(52) U.S. Cl.
CPC ...... *H01L 21/324* (2013.01); *H01L 21/02236* (2013.01); *H01L 21/164* (2013.01); *H01L 21/76251* (2013.01); *H01L 21/76828* (2013.01); *H01L 21/02164* (2013.01); *H01L 21/02255* (2013.01)

(58) Field of Classification Search
CPC ............ H01L 21/324; H01L 21/76251; H01L 21/02236; H01L 21/02255; H01L 21/02164; H01L 21/76828; H01L 21/164
See application file for complete search history.

(56) References Cited

U.S. PATENT DOCUMENTS

| | | | |
|---|---|---|---|
| 6,245,645 B1 * | 6/2001 | Mitani | ............ H01L 21/76251 257/E21.567 |
| 6,372,609 B1 * | 4/2002 | Aga | ................. H01L 21/76254 438/459 |
| 7,052,974 B2 * | 5/2006 | Mitani | ............... H01L 21/2007 257/E21.568 |
| 9,136,141 B2 * | 9/2015 | Koezuka | ............... H01L 21/324 |
| 2007/0148912 A1 * | 6/2007 | Morita | ............... H01L 21/2007 438/455 |

(Continued)

*Primary Examiner* — Zandra V Smith
*Assistant Examiner* — Jeremy J Joy
(74) *Attorney, Agent, or Firm* — Arch & Lake LLP

(57) ABSTRACT

The present disclosure provides an annealing method for improving interface bonding strength of a wafer. The method includes: providing a substrate, the substrate having a bonding interface; performing a first annealing step, wherein the first annealing step is practiced in an oxygen-containing atmosphere, and an oxidation protection layer is formed on a surface of the substrate through the annealing step; and performing a second annealing step upon the first annealing step, wherein a temperature of the second annealing step is higher than that of the first annealing step, and the second annealing step is practiced in a nitrogen-free environment.

6 Claims, 2 Drawing Sheets

(56) References Cited

U.S. PATENT DOCUMENTS

2009/0325363 A1* 12/2009 Ohnuma ........... H01L 21/76254
                                                            438/458
2017/0062267 A1* 3/2017 Koga ................ H01L 21/76251

* cited by examiner

ANNEALING METHOD FOR IMPROVING BONDING STRENGTH

The present application is based on and claims the priority to Chinese patent application No. CN201611227760.1, filed on Dec. 27, 2016, which is incorporated by reference herein in its entirety.

TECHNICAL FIELD

The present disclosure relates to the technical field of semiconductor materials, and in particular, relates to an annealing method for improving bonding strength of a wafer.

BACKGROUND

The semiconductor wafer bonding technique is critical to preparation of SOI materials, and the development of this technique promotes continuous advancement of three-dimensional integrated circuit and integration of different functional material-based devices. In the bonding technique, the bonding force between wafers is a key indicator in the bonding process, which determines whether the subsequent processes can be carried out, and affects finished product rate and quality of the products. Generally, the bonding is affected by such factors as cleanliness of the surface of the wafer, flatness of the bonding contact surface, activity of the bonding interface and the like. Therefore, enhancing the bonding strength is an important step to optimize the bonding process.

SUMMARY

The technical problem to be solved by the present disclosure is to provide an annealing method for improving bonding strength.

The annealing method includes: providing a substrate, the substrate having a bonding interface; performing a first annealing step, wherein the first annealing step is practiced in an oxygen-containing atmosphere, and an oxidation protection layer is formed on a surface of the substrate through the annealing step; and performing a second annealing step upon the first annealing step, wherein a temperature of the second annealing step is higher than that of the first annealing step, and the second annealing step is practiced in a nitrogen-free environment.

Optionally, the first annealing step is performed within a temperature range of 900° C. to 1350° C.

Optionally, the second annealing step is performed within a temperature range of 1000° C. to 1350° C.

Optionally, the first annealing step is practiced in a wet oxygen environment.

Optionally, the first annealing step is practiced in an oxygen-free environment.

Optionally, the insulating layer is made from silicon dioxide.

Optionally, the bonding interface is a silicon-oxidized silicon interface or a silicon-silicon interface.

Optionally, the oxidation protection layer has a thickness of greater than 40 nm.

According to the present disclosure, an oxidation protection layer is formed in the first step, which prevents external impurity elements from entering the bonding interface. The studies reveal that the nitrogen element is highly active, which exerts adverse effects on the bonding interface. Therefore, the second annealing step is practiced at an even higher temperature and in a nitrogen-free environment, to improve the strength of the bonding interface.

DETAILED DESCRIPTION

Specific practice of an annealing method for improving interface bonding strength of a wafer according to the present disclosure is described in detail with reference to the accompanying drawings.

Figure 1:
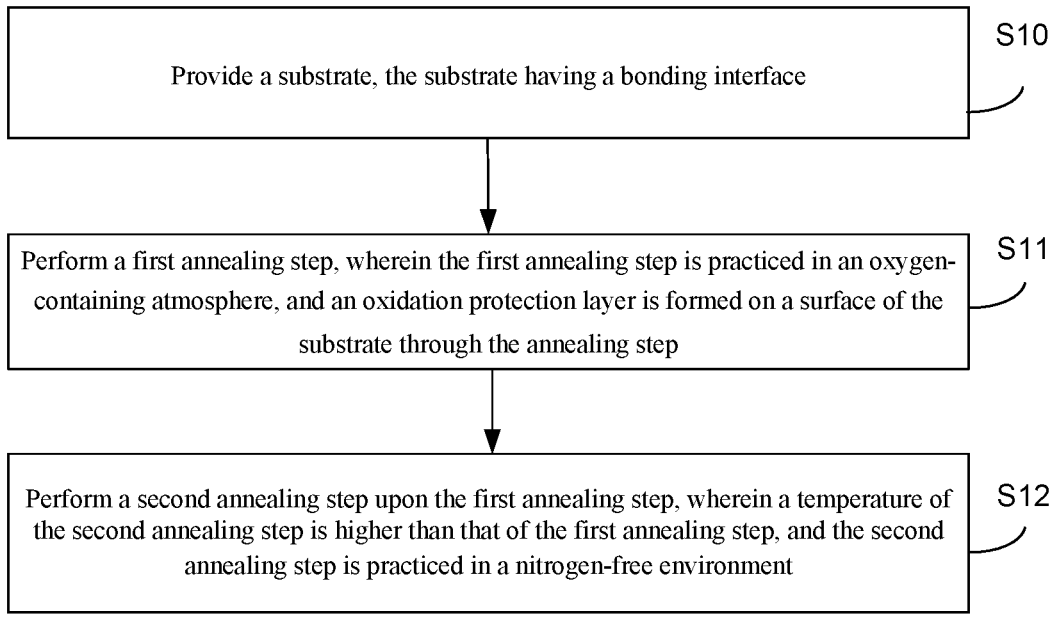
FIG. 1 is a schematic diagram of steps of an annealing method for improving bonding strength of a wafer according to an aspect of the present disclosure.

FIG. 1 is a schematic diagram of steps of an annealing method for improving bonding strength of a wafer according to an aspect of the present disclosure. The method includes: step S10 providing a substrate, the substrate having a bonding interface; step S11 performing a first annealing step, wherein the first annealing step is practiced in an oxygen-containing atmosphere, and an oxidation protection layer is formed on a surface of the substrate through the annealing step; and step S12 performing a second annealing step upon the first annealing step, wherein a temperature of the second annealing step is higher than that of the first annealing step, and the second annealing step is practiced in a nitrogen-free environment.

Figure 2A:
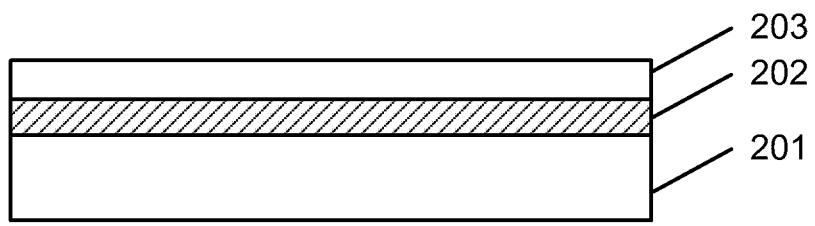
FIG. 2A illustrates the semiconductor substrate corresponding to a step in a schematic process according to an aspect of the present disclosure.

FIG. 2A is a schematic structural diagram of a substrate employed in this embodiment. Referring to step S10, a substrate 20 is provided, wherein the substrate has a bonding interface. In an aspect, the substrate 20 includes an insulating layer 202, a top semiconductor layer 203 on a surface of the insulating surface 202, and a supporting layer 201. The supporting layer 201 may be made from a semiconductor material, or may be made from a substrate material such as sapphire and the like that are applied in the microelectronic field. In this specific embodiment, the bonding interface is an interface between the insulating layer 202 and the top semiconductor layer 203. The insulating layer 202 is made from silicon dioxide, silicon nitride, silicon oxynitride, germanium-silicon oxide, germanium oxide, or another insulating material. In another specific embodiment, the bonding interface may also be a silicon-silicon interface.

Figure 2B:
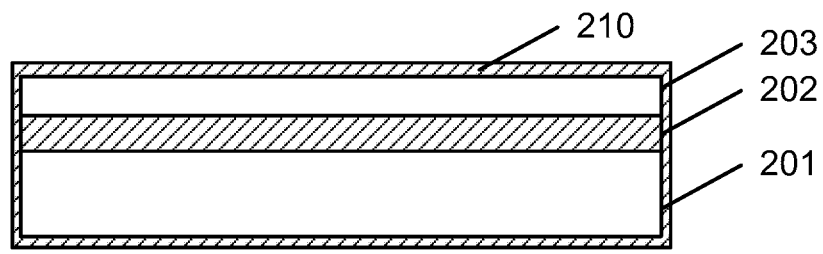
FIG. 2B illustrates the semiconductor substrate corresponding to a step in a schematic process according to an aspect of the present disclosure.

FIG. 2B is a schematic structural diagram of a substrate employed upon the first annealing step. Referring to step S11, a first annealing step is performed, wherein the first annealing step is practiced in an oxygen-containing atmosphere, and an oxidation protection layer 210 is formed on a surface of the substrate 20 through the annealing step. This step is preferably practiced in a wet oxygen environment. As such, the oxidation protection layer 210 may be quickly formed on the surface of the substrate 20. The oxidation protection layer 210 preferably has a thickness of greater than 40 nm.

Referring to step S12, a second annealing step is performed upon the first annealing step, wherein a temperature of the second annealing step is higher than that of the first annealing step, and the second annealing step is practiced in a nitrogen-free environment.

Figure 3:
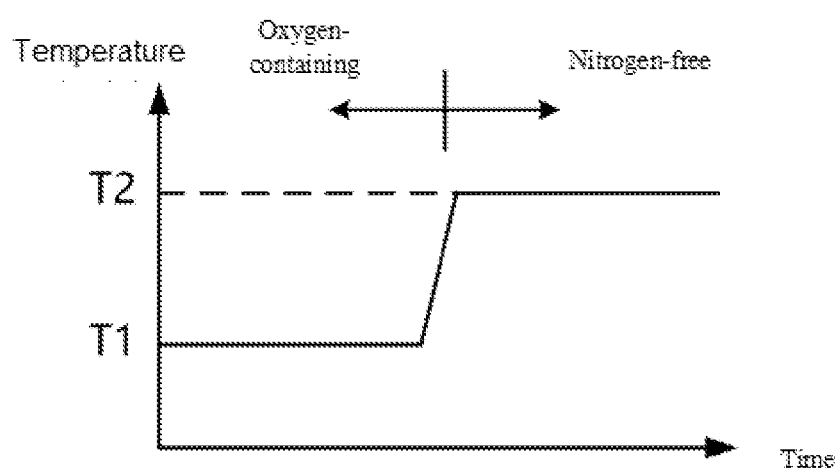
FIG. 3 is a temperature-time relationship diagram of two annealing steps performed in an aspect of the present disclosure.

FIG. 3 is a temperature-time relationship diagram of two annealing steps. The first annealing step S11 is performed at a temperature T1 that is preferably within a temperature range of 900° C. to 1350° C., and is preferably practiced in a wet oxygen environment. As such, the oxidation protection layer 210 may be quickly formed on the surface of the substrate 20, and this layer may prevent external impurity elements from diffusing to the bonding interface during the annealing process. The second annealing step S12 is performed at a temperature T2 that is preferably within a temperature range of 1000° C. to 1350° C., and is practiced in a nitrogen-free environment, for example, in an argon environment or a mixed gas of argon and oxygen. The annealing at an even higher temperature exerts a better solidification effect for the bonding surface, such that the oxidation protection layer 210 may prevent the external impurity elements from diffusing to the bonding interface. The studies reveal that the nitrogen element is highly active, and may be bonded to the atoms at the interface when entering the bonding interface to form a polar bond, thereby reducing the strength of the bonding interface. Therefore, step S12 is practiced at an even higher temperature and in a nitrogen-free environment, to improve the strength of the bonding interface.

Described above are preferred examples of the present disclosure. It should be noted that persons of ordinary skill in the art may derive other improvements or polishments without departing from the principles of the present disclosure. Such improvements and polishments shall be deemed as falling within the protection scope of the present disclosure.

What is claimed is:

1. An annealing method for improving interface bonding strength of a wafer, comprising:
   providing a substrate, the substrate having a bonding interface;
   performing a first annealing step, wherein the first annealing step is practiced in an oxygen-containing atmosphere, and an oxidation protection layer is formed on a surface of the substrate through the annealing step; and
   performing a second annealing step upon the first annealing step, wherein a temperature of the second annealing step is higher than that of the first annealing step, and the second annealing step is practiced in a nitrogen-free and a mixed gas of argon and oxygen environment.

2. The annealing method for improving interface bonding strength of a wafer according to claim 1, wherein the first annealing step is performed within a temperature range of 900° C. to 1350° C.

3. The annealing method for improving interface bonding strength of a wafer according to claim 1, wherein the second annealing step is performed within a temperature range of 1000° C. to 1350° C.

4. The annealing method for improving interface bonding strength of a wafer according to claim 1, wherein the first annealing step is practiced in a wet oxygen environment.

5. The annealing method for improving interface bonding strength of a wafer according to claim 1, wherein the bonding interface is a silicon-oxidized silicon interface or a silicon-silicon interface.

6. The annealing method for improving interface bonding strength of a wafer according to claim 1, wherein the oxidation protection layer has a thickness of greater than 40 nm.

* * * * *